United States Patent
Arikado

Patent Number: 6,041,996
Date of Patent: Mar. 28, 2000

[54] METHOD OF PRESSURE BONDING A BUMPED ELECTRONIC PART AND AN APPARATUS FOR PRESSURE BONDING A BUMPED ELECTRONIC PART

[75] Inventor: Kazuo Arikado, Umi-machi, Japan

[73] Assignee: Matsushita Electric Industrial Co., Ltd., Osaka, Japan

[21] Appl. No.: 08/975,543

[22] Filed: Nov. 20, 1997

[30] Foreign Application Priority Data

| Nov. 22, 1996 | [JP] | Japan | 8-311643 |
| Jan. 22, 1997 | [JP] | Japan | 9-009334 |

[51] Int. Cl.[7] .......................... B23K 31/02; B23K 31/12; B21D 39/00
[52] U.S. Cl. .................. 228/180.22; 228/103; 228/173.1
[58] Field of Search .............................. 228/5.5, 6.2, 3.1, 228/103, 173.1, 180.22, 173.2

[56] References Cited

U.S. PATENT DOCUMENTS

| 3,872,566 | 3/1975 | Pedrotti | 228/4.5 |
| 4,600,228 | 7/1986 | Tarbuck | 294/64.1 |
| 4,875,614 | 10/1989 | Cipolla et al. | 228/5.5 |
| 5,114,878 | 5/1992 | Maruyama et al. | 228/180.22 |
| 5,172,922 | 12/1992 | Kowaleski et al. | 279/3 |
| 5,185,509 | 2/1993 | Todd et al. | 219/85.16 |
| 5,308,132 | 5/1994 | Kirby et al. | 294/64.1 |
| 5,420,488 | 5/1995 | Gutman | 318/568.12 |
| 5,422,554 | 6/1995 | Rohde | 318/568.12 |
| 5,439,162 | 8/1995 | George et al. | 228/180.22 |
| 5,462,217 | 10/1995 | Simmons et al. | 228/180.22 |
| 5,485,949 | 1/1996 | Tomura et al. | 228/180.5 |

*Primary Examiner*—Patrick Ryan
*Assistant Examiner*—Kiley Stones
*Attorney, Agent, or Firm*—Pearne, Gordon, McCoy & Granger LLP

[57] ABSTRACT

A method of pressure bonding a bumped electronic part using: a tilting mechanism which tiltably supports a suction tool for sucking a bumped electronic part; and locking means for inhibiting a tilting operation of the tilting mechanism. The method includes: a suction step of sucking the bumped electronic part to the suction tool; a step of detecting the position of the bumped electronic part which is sucked to the suction tool, and positioning the bumped electronic part with respect to a substrate, under a state where the tilting operation is inhibited; and a pressure bonding step of pressure bonding bumps of the bumped electronic part which is sucked to the suction tool, to the substrate under a state where the tilting operation is enabled. According to this arrangement, the tilting mechanism is not accidentally swung during the positioning operation, and hence the mounting accuracy is prevented from being impaired.

4 Claims, 4 Drawing Sheets

METHOD OF PRESSURE BONDING A BUMPED ELECTRONIC PART AND AN APPARATUS FOR PRESSURE BONDING A BUMPED ELECTRONIC PART

BACKGROUND OF THE INVENTION

The invention relates to a method of pressure bonding a bumped electronic part and an apparatus for pressure bonding a bumped electronic part.

A bumped electronic part has a number of bumps on the lower face. Such a part can be correctly mounted on a substrate by uniformly pressure bonding all the bumps to electrodes of a circuit pattern of the substrate.

Generally, bumps of a bumped electronic part have different heights. When a substrate which is soft and easily flexible is used, the difference in height of the bumps may be absorbed by adjusting the degree of flexure of the substrate. However, substrates include those which are hard or only partially flexible, such as a glass epoxy substrate. When such a substrate is used, the difference in height of the bumps cannot be absorbed by adjusting the degree of flexure of the substrate.

In order to correctly mount a bumped electronic part as described above, all the bumps must be pressure bonded to electrodes of a substrate while the bumps are pressed against the electrodes by a uniform force. In an actual process, however, the difference in height of the bumps, when there is parallelism between the lower face of a suction tool for pressure bonding and the upper face of the substrate, causes a force to be concentrically applied only to a part of the bumps, so that nonuniform pressure bonding easily occurs. A method is known in which, in order to suppress nonuniform pressure bonding, a pressure bonding head has a tilting mechanism using a spherical bearing and the lower face (more correctly, the arrangement plane of bumps) of the suction tool imitates the upper face of the substrate.

The pressure bonding method of the prior art which uses a pressure bonding head has a problem in that, when a substrate and a bumped electronic part are to be positioned while the bumped electronic part is held by the suction tool, the suction tool swings because of the tilting mechanism, whereby the relative positions between electrodes of the substrate and the bumps are disordered.

The method has a further problem in that, when the bumped electronic part is to be bonded to the substrate while the bumped electronic part is held by the suction tool, the suction tool is rotated by the tilting mechanism in a direction (θ direction) about a Z-axis which is perpendicular to the substrate, whereby the relative positions between electrodes of the substrate and the bumps are disordered. When a flip chip in which bumps are formed on electrodes of a semiconductor IC is to be mounted on a substrate, particularly, the mounting must be conducted with high accuracy, and hence the problem is noticeable.

SUMMARY OF THE INVENTION

Therefore, it is an object of the invention to provide an apparatus for pressure bonding a bumped electronic part which can uniformly pressure bond bumps to a substrate and position them with respect to the substrate with high accuracy.

The method of pressure bonding a bumped electronic part set forth in claim 1 comprises: a suction step of sucking a bumped electronic part to the suction tool; a step of detecting a position of the bumped electronic part which is sucked to the suction tool, and positioning the bumped electronic part with respect to a substrate, under a state where the tilting operation of a tilting mechanism is inhibited; and a pressure bonding step of pressure bonding bumps of the bumped electronic part which is sucked to the suction tool, to the substrate under a state where the tilting operation is enabled.

According to the method of pressure bonding a bumped electronic part set forth in claim 1, under a state where the tilting operation is inhibited by the locking means, the position of a bumped electronic part which is sucked to the suction tool is detected and the positioning is conducted. Therefore, the tilting mechanism is prevented from rattling during the positioning, whereby the electronic part can be mounted with high accuracy.

In the apparatus for pressure bonding a bumped electronic part set forth in claim 3, a tilting mechanism comprises: a first stationary block in which a first arcuate face is formed in a lower face with being recessed, a rotation center of the first arcuate face being an X-axis which horizontally elongates; a first movable block which has an upper face abutting against the first arcuate face and which is swung along the first arcuate face; a second stationary block which is disposed below the first movable block and in which a second arcuate face is formed in a lower face with being recessed, a rotation center of the second arcuate face being a Y-axis which intersects with the X-axis in a horizontal plane; and a second movable block which has an upper face abutting against the second arcuate face and which is swung along the second arcuate face, and the apparatus comprises a suction tool which vacuum sucks the bumped electronic part and which is disposed below the second movable block.

According to the apparatus for pressure bonding a bumped electronic part set forth in claim 3, even when the substrate is not parallel with the bumps, the first and second movable blocks are swung along the first and second arcuate faces, respectively, so that the bumped electronic part sucked to the suction tool imitates the inclination of the upper face of the substrate, whereby all the bumps are uniformly pressure bonded to electrodes of the substrate. As a result, it is possible to eliminate the mounting failure. Since the first and second movable blocks are swung only about the X- and Y-axes, respectively, the positional displacement in the θ direction does not occur.

BRIEF DESCRIPTION OF THE DTAWINGS

DETAILED DESCRIPTION OF THE PREFERRED EMBODIMENT

Figure 1:
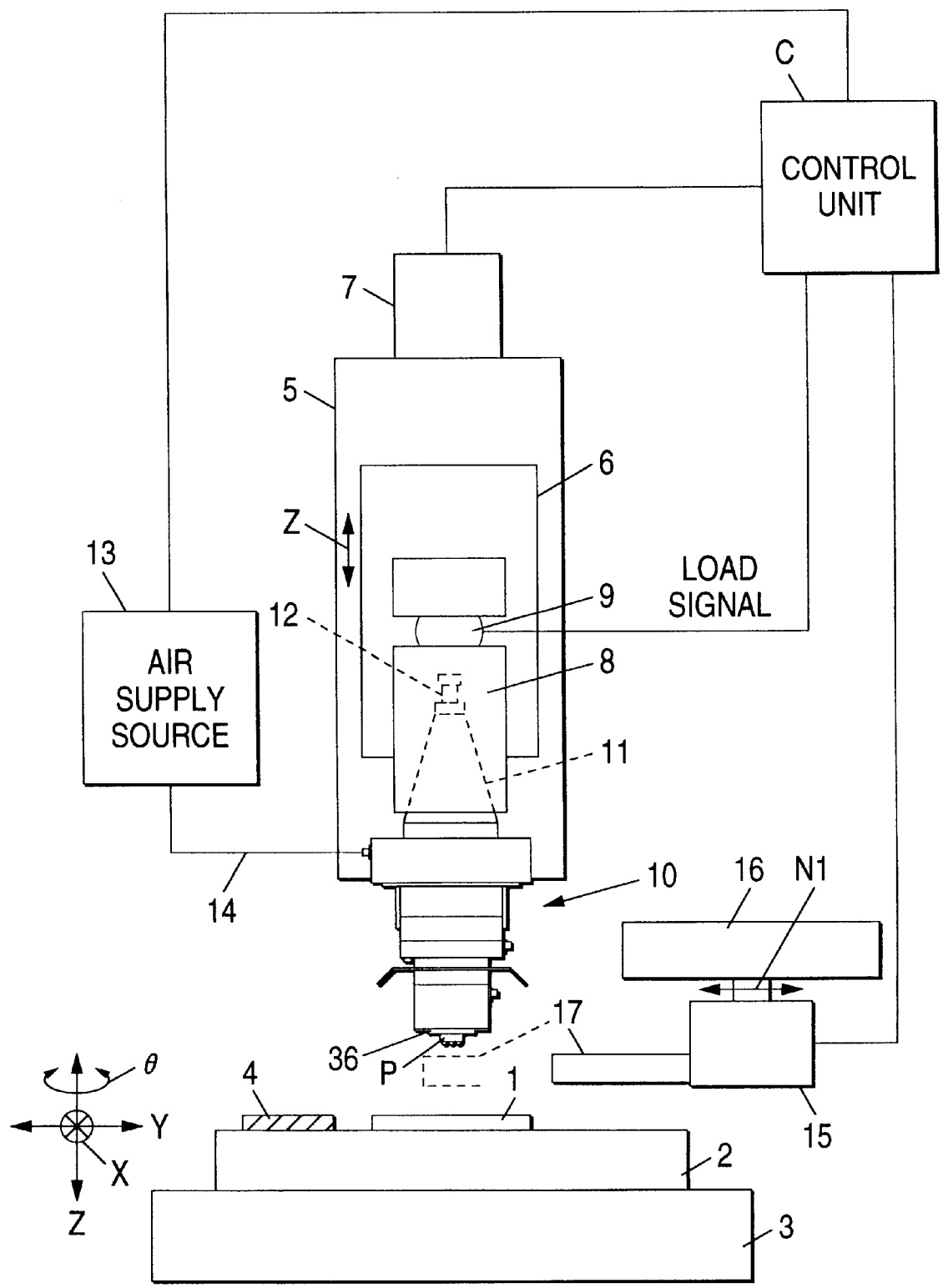
FIG. 1 is a block diagram of an apparatus for pressure bonding a bumped electronic part which is an embodiment of the invention.

Hereinafter, an embodiment of the invention will be described with reference to the accompanying drawings. FIG. 1 is a block diagram of an apparatus for pressure bonding a bumped electronic part which is an embodiment of the invention. As shown in FIG. 1, a substrate 1 is placed on a substrate holder 2 on a table 3. The table 3 is a movable table which horizontally moves the substrate 1 in the X- and Y-directions so as to place the substrate at a predetermined position. A level block 4 which is adjusted so as to attain sufficient levelness is disposed on the substrate holder 2.

A Z-table 5 which elevates an elevator plate 6 in the Z-direction by means of a Z-motor 7 is disposed above the substrate holder 2. A head holder 8 is fixed to the front face of the elevator plate 6. A load cell 9 measures a load acting on the head holder 8 and supplies a load signal to a control unit C. The load signal is used for detecting the contact of bumps which will be described later.

A header 11 of a pressure bonding head 10 is attached to the head holder 8. The header has a pull stud bolt 12. The pressure bonding head 10 is elevated integrally with the elevator plate 6. The pressure bonding head 10 is supplied with compressed air ejected from an air source 13 via a pipe 14. The compressed air is blown to first and second arcuate faces which will be described later. The structure of the pressure bonding head 10 will be described later in detail.

A detection device 15 which is caused to reciprocate in the direction of the arrow N1 by a movement shaft 16 is disposed at a side of the pressure bonding head 10. The detection device comprises a camera unit 17 which conducts vertical observation. As shown by the broken line in FIG. 1, the camera unit 17 reaches an area immediately below a bumped electronic part P which is sucked by the pressure bonding head 10, and observes bumps of the bumped electronic part P and a circuit pattern of the substrate 1.

Figure 2:
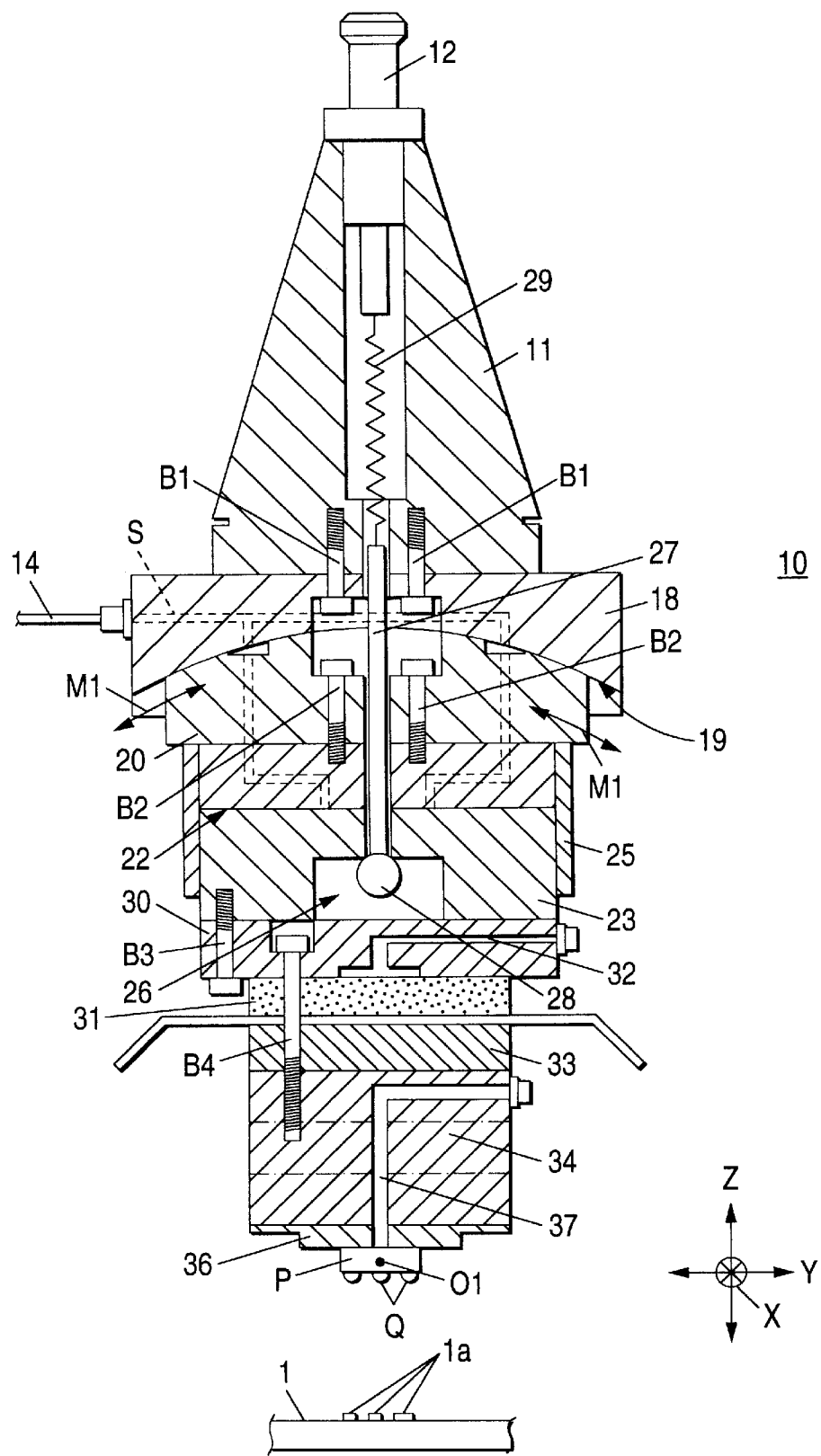
FIG. 2 is a section view of a pressure bonding head of the apparatus for pressure bonding a bumped electronic part of the embodiment of the invention.
Figure 3:
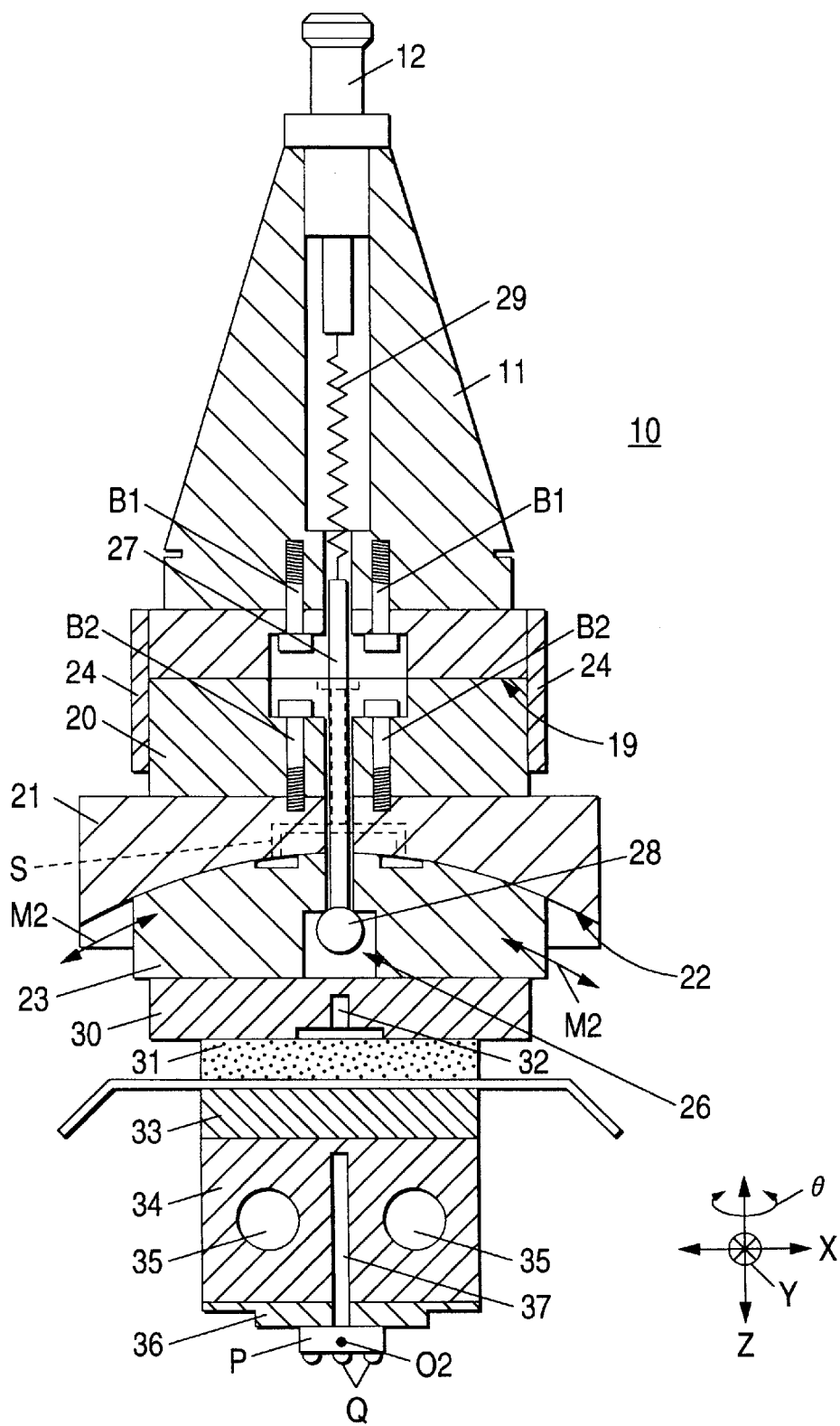
FIG. 3 is a section view of the pressure bonding head of the apparatus for pressure bonding a bumped electronic part of the embodiment of the invention.

The structure of the pressure bonding head 10 will be described with reference to FIGS. 2 and 3. A first stationary block 18 is fixed to a lower portion of the header 11 by bolts B1. A first arcuate face 19 is formed in a recessed manner in the lower face of the first stationary block 18. The rotation center of the first arcuate face is the X-axis which horizontally elongates. An arcuate upper face of a first movable block 20 abuts against the first arcuate face 19 of the first stationary block 18. The first movable block 20 is swung about the X-axis along the first arcuate face 19 (see the arrows M1 of FIG. 2). A second stationary block 21 is fixed to a lower portion of the first movable block 20 by bolts B2. A second arcuate face 22 is formed in the lower face of the second stationary block 21. The rotation center of the second arcuate face is the Y-axis which horizontally elongates and which is perpendicular to the X-axis. An arcuate upper face of a second movable block 23 abuts against the second arcuate face 22. The second movable block 23 is swung about the Y-axis along the second arcuate face 22 (see the arrows M2 of FIG. 3).

The bumped electronic part P is vacuum sucked to the lower face of a suction tool 36 as described later. The radii of curvature of the first and second arcuate faces 19 and 22 are determined so that the bumped electronic part P which is vacuum sucked to the suction tool 36 is positioned at the centers O1 and O2 of the first and second arcuate faces 19 and 22. According to this configuration, even when a tilting operation in the M1 or M2 direction is conducted, the position of the bumped electronic part P is not changed so as to be pressure bonded to a correct position of the substrate 1.

The first movable block 20 is restricted by X-guide plates 24 (FIG. 3) so as not to be displaced in the X-direction with respect to the first stationary block 18, and the second movable block 23 is restricted by Y-guide plates 25 (FIG. 2) so as not to be displaced in the Y-direction with respect to the second stationary block 21. Therefore, the first movable block 20 is swung only in the X-Z plane, and the second movable block 23 is swung only in the Y-Z plane which is perpendicular to the X-Z plane. According to this configuration, during a tilting operation, the first and second movable blocks 20 and 23 are prevented from being unnecessarily moved in the X- or Y-direction and rotated in the θ direction, so that the positional displacement of the bumped electronic part in the θ direction due to the tilting operation does not occur. A through hole which is coaxial with the pull stud bolt 12 is formed in the header 11, the first stationary block 18, the first movable block 20, the second stationary block 21, and the second movable block 23. A lifting rod 27 is slidably inserted into the through hole.

The lower end portion of the through hole in the second movable block 23 is expanded to form a ball seat 26. A ball 28 which is disposed at the lower end portion of the lifting rod 27 is situated in the ball seat 26. The upper end portion of the lifting rod 27 is upward urged by a spring 29. By the force of the spring 29, therefore, the arcuate upper face of the first movable block 20 is tightly pressingly contacted with the first arcuate face 19 and that of the second movable block 23 is tightly pressingly contacted with the second arcuate face 22.

The compressed air supplied via the pipe 14 can be ejected toward the first and second arcuate faces 19 and 22 through a passage circuit S that extends through the first stationary block 18, the first movable block 20, and the second stationary block. When the ejection is conducted, a small gap is formed on each of the first and second arcuate faces 19 and 22. At this time the first movable block 20 is allowed to be tilted (swung) in the direction of the arrows M1 with respect to the first stationary block 18, and the second movable block 23 is allowed to be tilted in the direction of the arrows M2 with respect to the second stationary block 21. By contrast, when the ejection is stopped, the tilting operation in the two directions is inhibited by the spring force applied to the ball 28, thereby establishing a tilt-locked state. In this way, the lifting rod 27, the ball 28, and the spring 29 constitute locking means for locking the swing of the first movable block 20 with respect to the first arcuate face 19 of the first movable block 20, and that of the second movable block 23 with respect to the second arcuate face 22 of the second movable block 23. The air source 13 and the pipe 14 constitute switching means for switching the supply/the supply stop of the compressed air to switch over the tilt lock and the cancellation of the tilt lock.

Alternatively, the locking means and the switching means may be realized by magnetic means. Specifically, the first and stationary blocks 18 and 21 may be configured by electromagnets, and the first and second movable blocks 20 and 23 may be made of a ferromagnetic material. When a magnetic force is generated, the first movable block 20 is sucked to the first stationary block 18 and the second movable block 23 is sucked to the second stationary block 21 so that the movable blocks are locked. When the magnetic force is reduced in level, the locked state is canceled.

An intermediate block 30 is fixed to the lower portion of the second movable block 23 by bolts B3. A porous plate 31, a heat insulating plate 33, and a heater block 34 are fixed to the lower portion of the intermediate block 30 by bolts B4, in this sequence as starting from the upper side. A first flow path 32 to which cold air is supplied is formed in the intermediate block 30. The cold air in the first flow path 32 passes through the inside of the porous plate 31, and is then ejected to the outside from the side face of the porous plate 31. This impedes the conduction of the heat of the heater block 34 which is generated by raising the temperature of the heater block 34 by means of a heater 35, to the upper components above the intermediate block 30, whereby the header 11, the first stationary block 18, the first movable block 20, the second stationary block 21, the second movable block 23, and the like are prevented from being thermally distorted.

The pressure bonding head 10 is attached to the head holder 8 by inserting the header 11 into the head holder 8. When the header 11 is thermally expanded by the heat conduction from the heater block 34 to be thermally distorted, it is difficult to insert into or detach the header 11 from the head holder 8, and hence the pressure bonding head 10 cannot be detached from the holder to be replaced with another one. When the first stationary block 18, the first movable block 20, the second stationary block 21, and the second movable block 23 are thermally distorted, also the arcuate faces are deformed and the tilting operation cannot be smoothly conducted, with the result that nonuniform pressure bonding of the bumps occurs. Therefore, the above-mentioned problem due to heat is solved by providing a heat insulating unit formed by the porous plate 31, the heat insulating plate 33, etc. In the embodiment, the heat insulating effect is sufficiently enhanced by forcedly blowing cold air into the porous plate 31.

The suction tool 36 which sucks the bumped electronic part P is fixed to the lower portion of the heater block 34. The bumped electronic part P is sucked by producing a negative pressure in a second flow path 37 which is formed in the suction tool 36 and the heater block 34. The reference letter Q designates the bumps of the bumped electronic part P.

Figure 4:
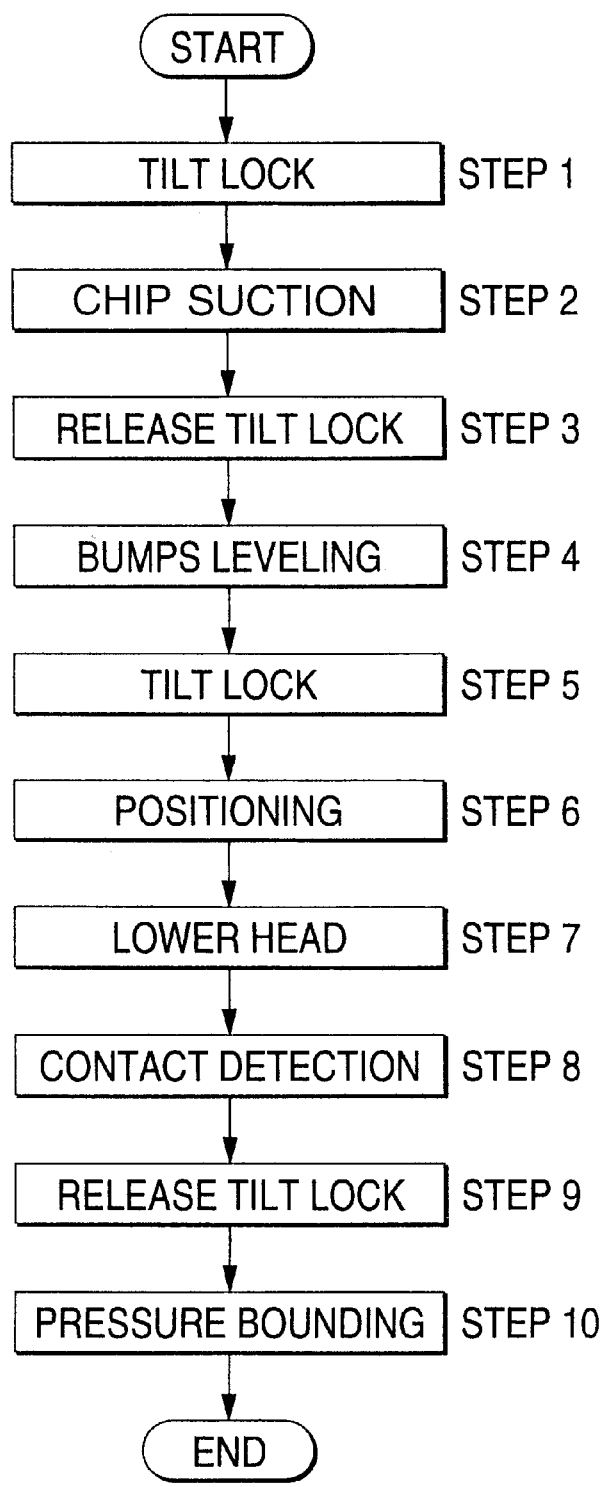
FIG. 4 is a flowchart of a method of pressure bonding a bumped electronic part which is an embodiment of the invention.

Next, the steps of the method of pressure bonding a bumped electronic part of the embodiment will be described with reference to FIG. 4. First, the ejection of the compressed air is stopped in step 1 so that the tilt-locked state is established, and the bumped electronic part P is then sucked to the suction tool 36 (step 2).

Next, the level block 4 is placed immediately below the pressure bonding head 10 and the compressed air is ejected. Under the state where the tilting operation is enabled, the pressure bonding head 10 is lowered toward the level block 4 and the bumps Q are pressed against the level block 4 so that the bumps Q are slightly collapsed (step 4).

As a result, taller bumps Q are collapsed by a larger degree.

Even if the bumps Q are different in height, the lower ends of the plural bumps Q are aligned in a single plane.

Thereafter, the tilt locking operation is conducted (step 5) so that the positions of the bumps Q the heights of which are uniformalized are maintained as they are. The pressure bonding head 10 is raised and the table 3 is moved so that the substrate 1 is positioned immediately below the pressure bonding head 10. As shown by the broken line in FIG. 1, the camera unit 17 is positioned immediately below the bumps Q and observes the bumps Q and the circuit pattern of the substrate 1 to detect the positions of the bumps and the pattern. The table 3 is further moved so that the relative positioning between the bumps and the pattern is conducted (step 6).

When the positioning operation is ended, the pressure bonding head 10 is lowered toward the substrate 1 while the tilt-locked state is maintained (step 7), and the load signal of the load cell 9 is monitored. When the bumps Q are contacted with the substrate 1, the load indicated by the load signal is rapidly increased. When such an increase is detected, it is judged that the bumps Q are contacted with the substrate (step 8).

When the contact is detected, the tilt-locked state is canceled (step 9), and the bumps Q are pressure bonded to the circuit pattern of the substrate 1 (step 10). In the embodiment, even when the upper face of the substrate 1 is not perfectly parallel with the plane in which the lower end faces of the plural bumps Q are aligned, the above-mentioned tilting operation in the directions of the arrows M1 and M2 enables the plane in which the bumps Q are aligned, to imitate the substrate 1 so that the plane and the substrate can be made perfectly parallel with each other. In this case, the bumped electronic part P is positioned at the centers O1 and O2 of the first and second arcuate faces 19 and 22, and hence the position of the bumped electronic part P is not changed even when the tilting operation is conducted. Consequently, the pressure bonding of the bumped electronic part P can be attained without causing positional displacement.

As a result, all the bumps Q are pressure bonded to electrodes 1a of the substrate 1 by a uniform force, whereby the mounting failure is prevented from occurring. The load applied during the pressure bonding is adjusted by controlling the Z-motor 7 by the control unit C which detects the load signal of the load cell 9.

According to the method of pressure bonding a bumped electronic part of the invention, under a state where the tilting operation is inhibited by the locking means, the position of a bumped electronic part which is sucked to the suction tool is detected and the positioning is conducted. Therefore, the tilting mechanism is prevented from rattling during the positioning, whereby the electronic part can be mounted with high accuracy.

According to the apparatus for pressure bonding a bumped electronic part of the invention, even when a substrate is not parallel with bumps, the first and second movable blocks are swung along the first and second arcuate faces, respectively, so that the bumped electronic part sucked to the suction tool imitates the inclination of the upper face of the substrate, whereby all the bumps are uniformly pressure bonded to electrodes of the substrate. As a result, it is possible to eliminate the mounting failure. Since the first and second movable blocks are swung only about the X- and Y-axes, respectively, the positional displacement in the e direction does not occur.

What is claimed is:

1. A method of pressure bonding a bumped electronic part to a substrate, said method using a suction tool, a tilting mechanism for tiltably supporting said suction tool, and locking means for inhibiting a tilting operation of said tilting mechanism, said method comprising the steps of:

sucking the bumped electronic part to said suction tool;

leveling the bumps of the bumped electronic part which is sucked to said suction tool;

detecting positions of the leveled bumps on the bumped electronic part by partially collapsing the bumps;

positioning the leveled bumps of the bumped electronic part with respect to the substrate when the tilting operation is inhibited; and pressure bonding the leveled bumps of the bumped electronic part, which is sucked to said suction tool, to the substrate when the tilting operation is permitted.

2. The method of claim 1, wherein the bumps are levelled when the tilting operation is permitted.

3. The method of claim 1, wherein the substrate has a circuit pattern formed thereon; and wherein during the positioning step, the leveled bumps are aligned with the circuit pattern; and wherein during the pressure bonding step, the leveled bumps are pressure bonded to the circuit pattern.

4. The method of claim 1, wherein said method further uses a porous plate connected to a heater block; and wherein said method further comprises the steps of:

heating the heater block; and blowing cold air into the porous plate.

* * * * *

UNITED STATES PATENT AND TRADEMARK OFFICE
CERTIFICATE OF CORRECTION

PATENT NO. : 6,041,996
DATED : March 28, 2000
INVENTOR(S) : Arikado

It is certified that error appears in the above-indentified patent and that said Letters Patent is hereby corrected as shown below:

Column 4, line 28, after "block" insert --21--.

Column 6, line 45, delete "e" and insert --θ--.

Signed and Sealed this

Twentieth Day of March, 2001

Attest:

NICHOLAS P. GODICI

Attesting Officer     Acting Director of the United States Patent and Trademark Office